(12) United States Patent
Niemann

(10) Patent No.: US 8,896,331 B2
(45) Date of Patent: Nov. 25, 2014

(54) IMPEDANCE MEASURING INSTRUMENT

(75) Inventor: James A. Niemann, Aurora, OH (US)

(73) Assignee: Keithley Instruments, Inc., Cleveland, OH (US)

(*) Notice: Subject to any disclaimer, the term of this patent is extended or adjusted under 35 U.S.C. 154(b) by 752 days.

(21) Appl. No.: 12/024,721

(22) Filed: Feb. 1, 2008

(65) Prior Publication Data

US 2009/0195261 A1 Aug. 6, 2009

(51) Int. Cl.
*G01R 27/08* (2006.01)

(52) U.S. Cl.
USPC ............................................. 324/713

(58) Field of Classification Search
None
See application file for complete search history.

(56) References Cited

U.S. PATENT DOCUMENTS

| | | | |
|---|---|---|---|
| 3,979,684 A * | 9/1976 | Acker | 327/556 |
| 4,885,528 A * | 12/1989 | Tanaka et al. | 324/713 |
| 5,086,278 A * | 2/1992 | Wakamatsu et al. | 324/605 |
| 6,693,439 B1 * | 2/2004 | Liu et al. | 324/613 |
| 6,825,653 B2 * | 11/2004 | Benes et al. | 324/158.1 |
| 7,078,927 B2 * | 7/2006 | Tanida et al. | 324/765 |
| 7,215,130 B2 * | 5/2007 | Thibedeau et al. | 324/691 |

FOREIGN PATENT DOCUMENTS

| | | |
|---|---|---|
| JP | 1987-203466 | 12/1987 |
| JP | 2009-109375 A | 5/2009 |

* cited by examiner

*Primary Examiner* — Thomas F Valone
(74) *Attorney, Agent, or Firm* — Pearne & Gordon LLP

(57) ABSTRACT

A measurement instrument for measuring the impedance of a device under test (DUT) includes a first source of either a voltage or a current and a second source of either a voltage or a current, wherein the first source is connectable in a first feedback relationship with the DUT and the second source is connectable in a second feedback relationship with both the DUT and the first source. The first and second sources are operated respectively as a current source responsive to the current through the DUT and a voltage source responsive to the voltage across the DUT or operated respectively as a voltage source responsive to the voltage across the DUT and a current source responsive to the current through the DUT. The second feedback relationship has a narrower bandwidth than the first feedback relationship. The resulting voltage across the DUT and the current through the DUT establish the measured impedance of the DUT.

4 Claims, 2 Drawing Sheets

IMPEDANCE MEASURING INSTRUMENT

BACKGROUND OF THE INVENTION

The present invention relates to the measurement of electrical impedances and, in particular, to the measurement of the impedance of very reactive loads.

It is generally difficult to measure the impedance of very reactive loads because the value changes so rapidly with respect to frequency.

For example, solar cells may appear so capacitive that nearly any voltage applied by a test instrument will want to oscillate into the cell's highly reactive load. Making matters worse, the noise in the test voltage will also result in corresponding large noise currents in the low impedance of the cell. Batteries and "super" capacitors also have these issues.

A similar circumstance can occur, for example, in high efficiency motors, such as some rare-earth permanent magnet motors which may appear so inductive that nearly any current applied by a test instrument will produce analogous results.

SUMMARY OF THE INVENTION

A measurement instrument for measuring the impedance of a device under test (DUT) includes a first source of either a voltage or a current and a second source of either a voltage or a current, wherein the first source is connectable in a first feedback relationship with the DUT and the second source is connectable in a second feedback relationship with both the DUT and the first source. The first and second sources are operated respectively as a current source responsive to the current through the DUT and a voltage source responsive to the voltage across the DUT or operated respectively as a voltage source responsive to the voltage across the DUT and a current source responsive to the current through the DUT. The second feedback relationship has a narrower bandwidth than the first feedback relationship. The resulting voltage across the DUT and the current through the DUT establish the measured impedance of the DUT.

DESCRIPTION OF THE PREFERRED EMBODIMENTS

Figure 1:
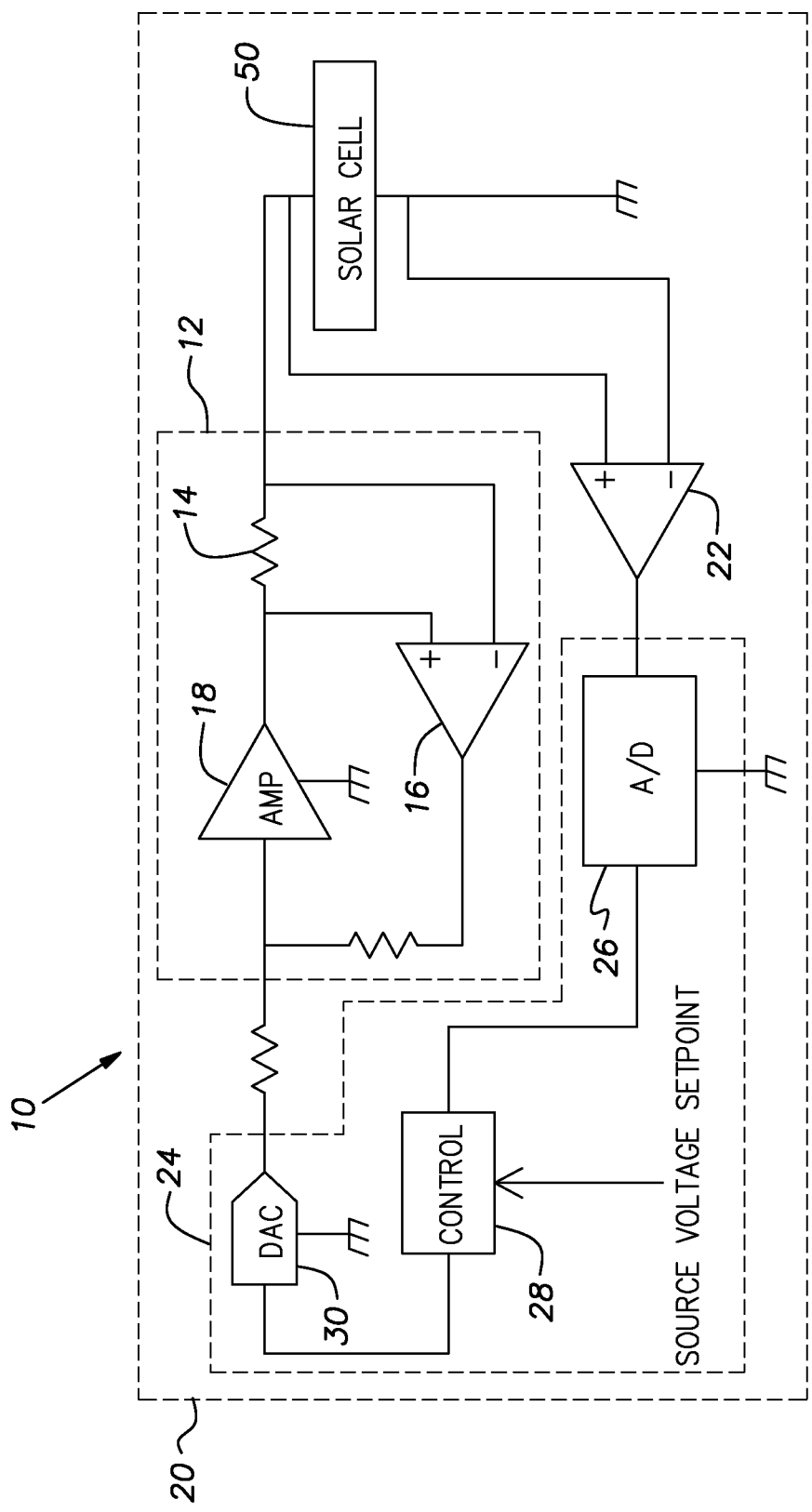
FIG. 1 is a schematic diagram of an example of an instrument according to the invention.

Referring to FIG. 1, a measurement instrument 10 for measuring the impedance of a solar cell 50 includes a first feedback loop 12 that is responsive to the current through the cell 50 as sensed by the resistor 14. The voltage across the resistor 14 is applied across a differential amplifier 16 and fed back to the input of the amplifier 18. The instrument 10 also includes a second feedback loop 20 that is responsive to the voltage across the cell 50. The voltage across the cell 50 is applied across a differential amplifier 22 and fed back through a voltage source 24 and also the feedback loop 12. As shown in FIG. 1, the feedback loop 12 is contained within the feedback loop 20. In this example, the voltage source 24 is implemented digitally with an A/D 26, a digital control 28 responsive to the input of a desired voltage setpoint and a DAC 30 that converts back to an analog signal, but other digital or analog implementations could be used instead. The output of the voltage source 24 is the input of the feedback loop 12.

The configuration of the instrument 10 results in the desired voltage being applied to the cell 50 without undesired oscillations and noise currents that would likely be present if the feedback loop 12 was not included. The desired voltage in combination with the resulting current through the cell 50 are then used to calculate the impedance of the cell 50.

It is advantageous for the second feedback loop 20 to have a smaller frequency bandwidth than that of the first feedback loop 12. The second loop 20 then effectively establishes the DC bias of the cell 50 and the first feedback loop 12 keeps the voltage stable as it is varied to produce different data points.

Figure 2:
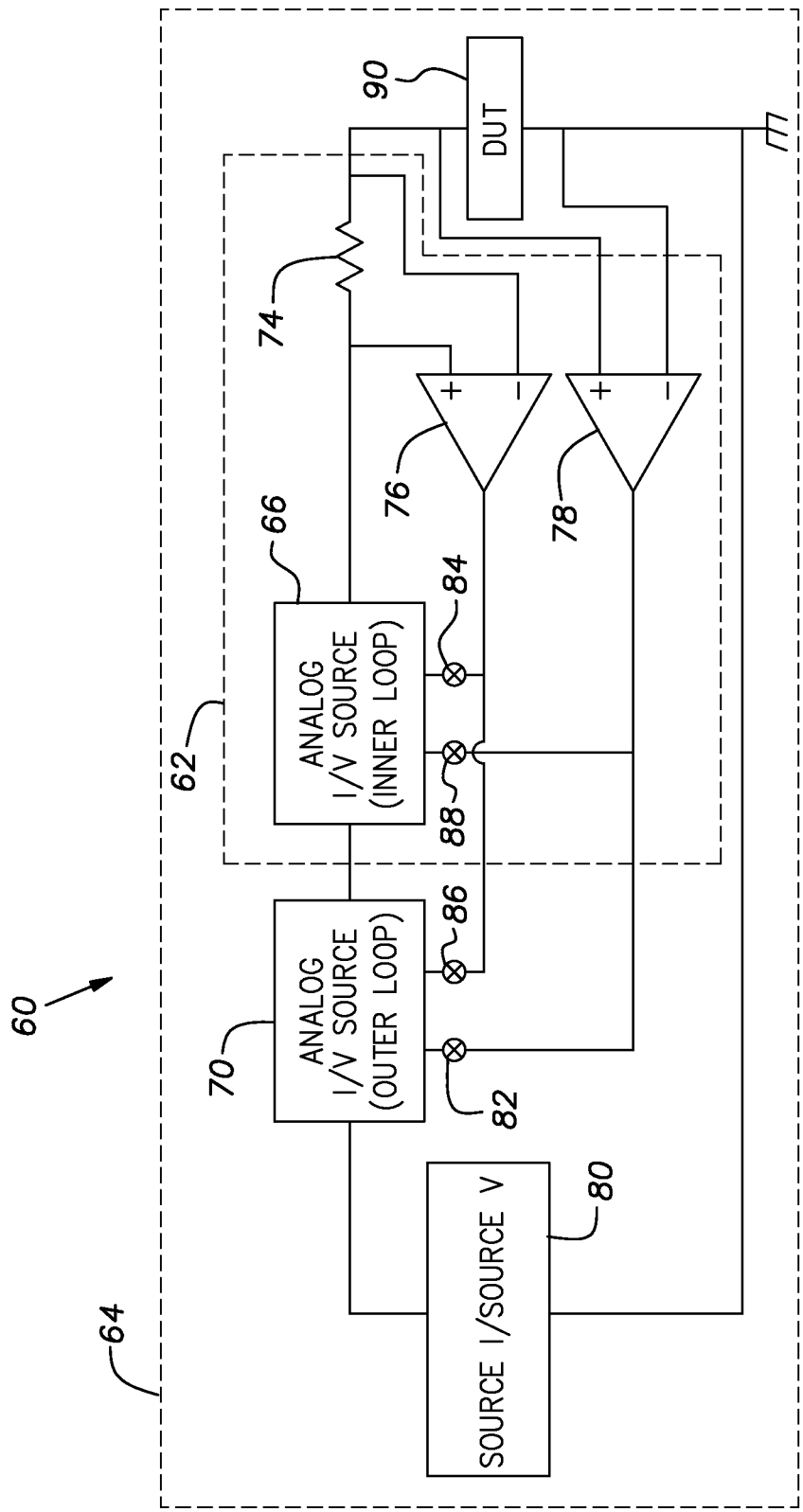
FIG. 2 is a schematic diagram of another example of an instrument according to the invention.

Referring to FIG. 2, a more generalized measurement instrument 60 for measuring the impedance of a device under test (DUT) 90 includes a first feedback loop 62 and a second feedback loop 64. As shown in FIG. 2, the feedback loop 62 is contained within the feedback loop 64. The feedback loop 62 includes a selectable voltage/current source 66. Such sources are commonly available as so-called source measure units (SMUs) that source a current or voltage and measure a voltage/current, but other implementations are possible. The feedback loop 64 includes the feedback loop 62 and a selectable voltage/current source 70. The sources 66, 70 can also include the ability to measure the resulting voltage/current. The resister 74 senses the current through the DUT 90. The voltage across the resistor 74 is applied to the differential amplifier 76. The voltage across the DUT 90 is applied to the differential amplifier 78. A current/voltage setpoint 80 sets the operating point of the instrument 60.

The instrument 60 can be run in a mode similar to that of FIG. 1. In that mode, the setpoint 80 is set to a desired voltage, the source 70 is set to source voltage, the source 66 is set to source current, the switches 82, 84 are closed and the switches 86, 88 are open. The current in the DUT 90 is then monitored by the source 66 and the voltage across the DUT 90 is monitored by the source 70. This mode is particularly useful for a DUT having a very large capacitance such as a solar cell.

If the bandwidth of the second feedback loop 64 is less than that of the feedback loop 62, then the second loop 64 effectively establishes the DC bias of the DUT 90 and the first feedback loop 62 keeps the voltage stable as it is varied to produce different data points. The voltage setpoint and the measured current through the DUT then establish a value for the DUT impedance.

The instrument 60 can also be run in an analogous mode. In this mode, the setpoint 80 is set to a desired current, the source 70 is set to source current, the source 66 is set to source voltage, the switches 82, 84 are open and the switches 86, 88 are closed. The current in the DUT 90 is then monitored by the source 70 and the voltage across the DUT 90 is monitored by the source 66. This mode is particularly useful for a DUT having a very large inductance such as a high-efficiency motor.

If the bandwidth of the second feedback loop 64 is less than that of the feedback loop 62, then the second loop 64 effectively establishes the DC bias of the DUT 90 and the first feedback loop 62 keeps the current stable as it is varied to produce different data points. The current setpoint and the measured voltage through the DUT then establish a value for the DUT impedance.

While the above description has focused on primarily analog implementation of the invention, it is also possible to implement the feedback and measurements in various digital techniques or combinations of digital and analog.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A measurement instrument for measuring the impedance of a device under test (DUT), said instrument comprising:
   a first source of either a voltage or a current; and
   a second source of either a voltage or a current, wherein the first source is connectable in a first feedback relationship with said DUT and said second source is connectable in a second feedback relationship with said DUT, said first feedback relationship being contained within said second feedback relationship, said first and second sources being operated respectively as a current source responsive to the current through the DUT and a voltage source responsive to the voltage across the DUT or operated respectively as a voltage source responsive to the voltage across the DUT and a current source responsive to the current through the DUT, said second feedback relationship having a narrower loop bandwidth than said first feedback relationship, the resulting voltage across the DUT and the current through the DUT establishing the measured impedance of the DUT.

2. A measurement instrument according to claim 1, wherein said DUT is a solar cell, said first source is a current source and said second source is a voltage source.

3. A measurement instrument according to claim 1, wherein said DUT is a motor, said first source is a voltage source and said second source is a current source.

4. A measurement instrument according to claim 1, wherein said second source provides a DC operating point for said DUT.

* * * * *